(12) United States Patent
Liufu

(10) Patent No.: US 7,132,057 B2
(45) Date of Patent: Nov. 7, 2006

(54) COMPOSITIONS FOR HIGH POWER PIEZOELECTRIC CERAMICS

(75) Inventor: De Liufu, Carmel, IN (US)

(73) Assignee: Piezotech, LLC, Indianapolis, IN (US)

( * ) Notice: Subject to any disclaimer, the term of this patent is extended or adjusted under 35 U.S.C. 154(b) by 0 days.

(21) Appl. No.: 10/686,310

(22) Filed: Oct. 15, 2003

(65) Prior Publication Data

US 2005/0085373 A1    Apr. 21, 2005

(51) Int. Cl.
  *C04B 35/493* (2006.01)
(52) U.S. Cl. .............................. 252/62.9 PZ; 501/134
(58) Field of Classification Search ......... 252/62.9 PZ; 501/134; 310/311, 358
  See application file for complete search history.

(56) References Cited

U.S. PATENT DOCUMENTS

| | | | | |
|---|---|---|---|---|
| 4,948,767 A | * | 8/1990 | Ushida et al. | 501/134 |
| 5,849,211 A | * | 12/1998 | Hase et al. | 252/62.9 PZ |
| 6,140,746 A | * | 10/2000 | Miyashita et al. | 310/358 |

FOREIGN PATENT DOCUMENTS

| | | | |
|---|---|---|---|
| DE | 1646699 | * | 5/1972 |
| EP | 344978 | * | 12/1989 |

* cited by examiner

*Primary Examiner*—C. Melissa Koslow
(74) *Attorney, Agent, or Firm*—Woodard, Emhardt, Moriarty, McNett & Henry LLP

(57) ABSTRACT

This invention relates to a piezoelectric ceramic of the formula $Pb_{(1-z)}M_z(Mg_{1/3}Nb_{2/3})_x(Zr_yTi_{1-y})_{1-x}O_3$ where M can be either Sr or Ba or both and x is in between about 0.1 and about 0.7, y is between about 0.2 and about 0.7, and z is between about 0.02 and about 0.1 and to method for preparing the piezoelectric ceramic. The piezoelectric ceramic is provided as a composite perovskite structure. Additional materials or dopants can be added to the piezoelectric ceramic of the present invention. Example of dopants that can be added to the piezoelectric ceramic include, but are not limited to: $MnO_2$, $Ni_2O_3$, $TeO_3$, $TeO2$, $MoO_3$, $Nb_2O_5$, $Ta_2O_5$, $CoCO_3$, and $Y_2O_3$. The piezoelectric ceramics of the present invention can be used to fabricate piezoelectric elements for a wide variety of devices that can be fabricated to exhibit high power applications including miniaturized displacement elements, buzzers, transducers, ultrasonic sensors and ultrasonic generators, and the like.

5 Claims, 1 Drawing Sheet

COMPOSITIONS FOR HIGH POWER PIEZOELECTRIC CERAMICS

BACKGROUND OF THE INVENTION

In general, the present invention relates to piezoelectric ceramic compositions, articles formed from these compositions, and methods for preparing the piezoelectric ceramic compositions and articles.

Piezoelectric elements are widely used in a variety of electronic components including ceramic resonators, ceramic filters, piezoelectric displacement elements, buzzers, transducers, ultrasonic receivers and ultrasonic generators, etc. Consequently, the use of the piezoelectric ceramic compositions to form the elements is increasing. The different uses or applications require different electromechanical characteristics from the piezoelectric ceramics. Furthermore, there is continued drive towards increasingly smaller electronic components. Consequently, there is a concomitant demand for smaller piezoelectric elements to use in these electronic components. However, many of the smaller electronic components require that the piezoelectric elements provide the same or even greater output power, despite their reduced size.

Existing high power piezoelectric ceramics often do not exhibit suitable electromechanical properties for use in miniaturized electronic devices, such as miniaturized ultrasonic devices. In the current state of the art, the existing piezoelectric elements that are sufficiently small to be used in the miniaturized devices exhibit low capacitance and high electrical impedance. This is inadequate to drive the miniaturized devices. Furthermore, the dielectric loss factor (tan δ) of the current piezoelectric elements is too high resulting in internal heating and dissipative loss, which will significantly decrease the efficiency and output of the device. Consequently, existing piezoelectric ceramics have not provided adequate electromechanical properties for these miniaturized electronic devices.

The electromechanical properties of the piezoelectric ceramics can be altered by varying the specific ceramic composition, the ceramic or molecular structure, and/or the methods and parameters for fabricating the piezoelectric ceramic.

Common piezoelectric ceramics can be formed from of a variety of general classes or types of ceramics. One class is a lead-zirconium titanate ceramic (PZT); another class is a lead-magnesium niobium ceramic (PMN). In many cases, solid solutions of either the PZT or the PMN ceramic are prepared in which discreet components or ceramic particles are distributed either homogeneously or inhomogeneously in the bulk matrix—either the PZT ceramic or the PMN ceramic. The discreet components can be found in the interstitial spaces of the crystal units of the bulk matrix. The added components can provide additional characteristics to the resulting piezoelectric ceramic. Additionally, dopants have been added to the piezoelectric ceramic matrix to modify a variety of factors, including the Curie temperature, the mechanical quality factor, the dielectric dissipation factor, and the like.

In addition, methods used to fabricate the piezoelectric ceramics vary widely. In particular the specific heat treatment regimes and poling processes can have a dramatic effect of on both the physical properties and the electrical properties of the resulting ceramics. It is often problematic to fabricate a suitable ceramic that forms a uniform, single phase having a desired crystal structure and/or that does not crack under the strain in use.

As with many ceramic fabrication techniques, the processing parameters typically are tailored to the specific ceramic composition and its intended use. Furthermore, even the known processing parameters used for a specific class or type of ceramic still can be varied to provide a unique piezoelectric ceramic having desired electromechanical properties. However, the effect of the changes on the electromechanical properties typically cannot be predicted a priori-a without extensive experimentation both as to the composition and to the method of fabrication. Consequently, it is still very difficult to adequately prepare piezoelectric ceramics having the desired electromechanical properties for miniaturized electronic devices.

In light of the above problems, there is a continuing need for advances in the relevant field including new piezoelectric ceramic compositions, piezoelectric elements formed from the compositions, and methods of fabricating the compositions and the elements. The present invention addresses that need and provides a wide variety of benefits and advantages.

BRIEF SUMMARY OF THE INVENTION

The present invention relates to high power piezoelectric ceramics and the manufacture and use thereof. Various aspects of the invention are novel, nonobvious, and provide various advantages. While the actual nature of the invention covered herein can only be determined with reference to the claims appended hereto, certain forms and features, which are characteristic of the preferred embodiments disclosed herein, are described briefly as follows.

In one form the present invention provides a novel ceramic composition illustrated by Formula 1 below:

$$Pb_{(1-z)}M_z(Mg_{1/3}Nb_{2/3})_x(Zr_yTi_{1-y})_{1-x}O_3 \qquad (1)$$

wherein M is selected to be either Sr or Ba, x is selected to be between about 0.1 and about 0.7, y is selected to be between about 0.20 and about 0.70, and z is selected to be between about 0.02 and about 0.1. In preferred embodiment of the above composition, one or more dopants are added to the compositions. The dopants can be selected from the group comprising: $MnO_2$, $Ni_2O_3$, $TeO_2$, $MoO_3$, $Nb_2O_5$, $Ta_2O_5$, $Y_2O_3$, $CoCO_3$, $Sm_2O_3$, and mixtures thereof. The dopants can be added to the ceramic composition in individual amounts ranging up to about, more preferably between about 0.01 wt % and about 2.0 wt %.

The preferred ceramic compositions of the present invention exhibit suitable electromechanical properties for use as piezoelectric elements in miniaturized electronic devices. The preferred piezoelectric ceramics of the invention exhibit one or more of the following electromechanical properties: a relative permittiivity (∈) of between about 2000 and about 4000, a mechanical quality factor ($Q_m$) of between about 900 and about 2000; a piezoelectric strain constant (d33) of between about 250–500 PC/N, Dielectric loss factor (tan δ) of between about 0.002–0.008 and a thickness electromechanical coupling coefficient ($k_t$) of between about 0.4 and about 0.7. Additionally, the preferred provoskite ceramics of the present invention have a Curie temperature value of between about 200 and about 300° C.

In another form the present invention provides a method for preparing a piezoelectric ceramic. The method comprises: providing a powdered mixture comprising lead, magnesium, niobium zirconium, titanium, and at least one of strontium or barium; pulverizing the powdered mixture provide a homogeneously mixture having an average particle size of less than about 1 micrometer; calcining the homogeneous mixture at a temperature of between about 800° C. and about 1000° C. to provide a ceramic composition; molding the ceramic composition into a green article of a desired shape; sintering the green article at a selected temperature of between about 1000° C. and about 1300° C. to provide a monolithic ceramic article having a perovskite crystal structure; and poling the monolithic ceramic article at a voltage selected to be between about 50 to about 80 V/mil thickness of material at a temperature of between about 100° C. and about 120° C. to provide the piezoelectric ceramic.

It is an object of the present invention to provide high power piezoelectric ceramics.

Further objects, features, aspects, forms, advantages, and benefits shall become apparent from the description and drawings contained herein.

DETAILED DESCRIPTION OF THE INVENTION

Figure 1:
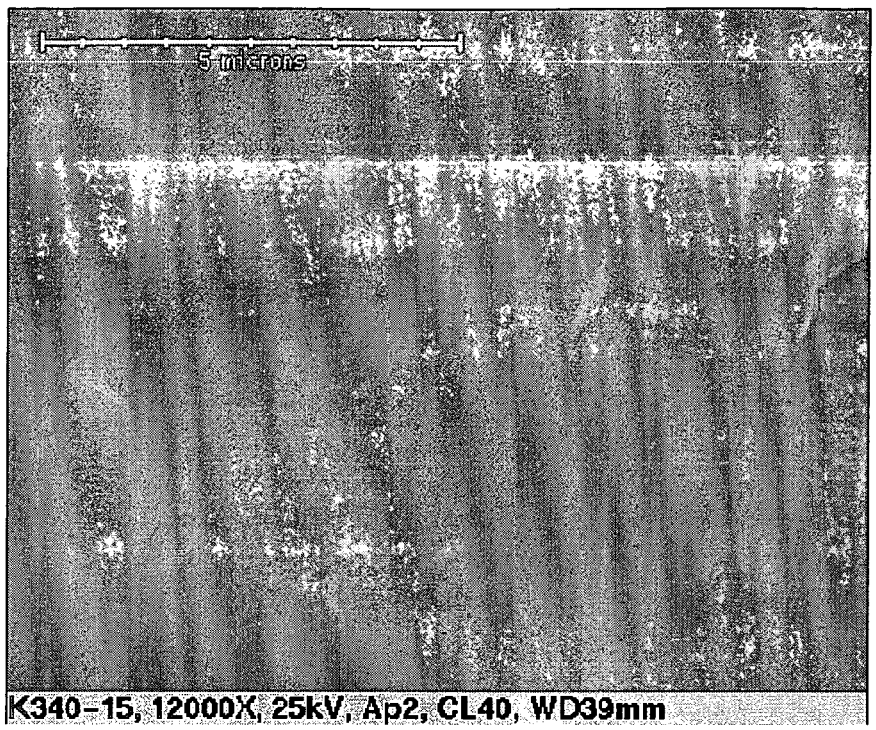
FIG. 1 is a scanned image of a micrograph of the ferroelectric ceramic composition described in Example 1 before poling.

For the purposes of promoting an understanding of the principles of the invention, specific embodiments will be described. It will nevertheless be understood that no limitation of the scope of the invention is thereby intended. Any alterations and further modifications in the described compositions, elements, processes, or devices, and any further applications of the principles of the invention as described herein, are contemplated as would normally occur to one skilled in the art to which the invention relates.

The present invention provides novel compositions of piezoelectric ceramics that have advantageous use for high power applications. Existing high power piezoelectric ceramics do not exhibit suitable electromechanical properties to provide miniaturized devices such as ultrasonic devices and the like. With the miniature devices, the element sizes are often sufficiently small so the resulting capacitance of the piezoelectric ceramic is exceedingly small, and the electrical impedance is too high for useful or adequate electrical driving of many electrical devices. In contrast, the preferred compositions of the present invention can be characterized by exhibiting a high permittivity ($\in_r$) and/or a high mechanical quality factor ($Q_m$). This, in turn, provides a high capacitance and low impedance for high electrical driving. In certain embodiments, the composition exhibits a relative permittivity of at least 2000 F/m; more preferably at least 2500 F/m. In other embodiments, the composition exhibits a mechanical quality factor ($Q_m$) of at least 900. Still yet in other embodiments the composition exhibits a piezoelectric strain constant ($d_{33}$) of at least 300 PC/N. In addition, the dielectric loss factor (tan δ) is sufficiently low to minimize internal heating effects, which can drain electrical power from the device and, in the worst case, cause the device to ultimately fail.

In preferred embodiments of the present invention, the piezoelectric ceramics can be used for form piezoelectric elements that can produce significantly greater amount of acoustical power than the current state-of-the-art high power piezoelectric ceramics for the same size element. Alternatively, the present invention can provide piezoelectric ceramics for use in microelectronics and can be used to produce a much smaller element while yet providing the same acoustical power output as significantly larger elements.

The present invention provides a novel piezoelectric ceramic composition. Preferably, the novel piezoelectric ceramic composition is a composite perovskite crystal structure. In preferred embodiments, the composite perovskite ceramic provides a unique crystal structure and can be provided as a single-phase ceramic composition. By use of the term "composite perovskite crystal structure", it is intended to encompass ceramic compositions exhibiting a unique crystal structure prepared by combining the selected elements in a unique, stoichiometric ratio, and where each element or type of element is located at a crystallographically predictable or determinable site, typically a lattice site within the crystal structure. Consequently, in one embodiment, the piezoelectric ceramic composition does not exhibit the same properties normally exhibited by a solid solution of metals, or metal oxides in a ceramic matrix. In other embodiments, the preferred piezoelectric ceramic composition of the present invention exists as a composite perovskite crystal structure with one or more added dopants which may be located in the interstitial sites of the crystal lattice. The added dopants are discussed more fully below.

The preferred formula for the ceramic composition, which can be made piezoelectric according to the present invention is illustrated below in Formula 1:

$$Pb_{(1-z)}M_z(Mg_{1/3}Nb_{2/3})_x(Zr_yTi_{1-y})_{1-x}O_3 \qquad (1)$$

where M is selected to be either Sr or Ba, x is between about 0.1 and about 0.7, y is between about 0.20 and about 0.70, and z is between about 0.02 and about 0.1. In alternative embodiments, x can be selected to be between about 0.2 and about 0.4, y is selected to be between 0.2 and about 0.5, and z is selected to be between about 0.04 and about 0.08. A particularly preferred ceramic composition for the present invention is represented by the following formula $Pb_{0.94}Sr_{0.06}(Mg_{1/3}Nb_{2/3})_{0.375}(Zr_{0.392}Ti_{0.624})_{0.625}O_3$, which also can be represented as 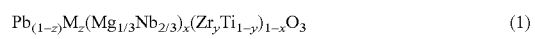 $Pb_{0.94}Sr_{0.06}Mg_{0.125}Nb_{0.250}Zr_{0.245}Ti_{0.39}O_3$.

The preferred composition of the present invention can be prepared by selecting metal containing precursors and combining the metal containing precursors in a selected relative ratio to provide the desired stoichiometric composition of Formula 1 above. In the above formula, it can be thought of as the perovskite structure of the $ABO_3$ type. In this formula type, the stoichiometric ratio of the A type element or component to the B type element or component is 1:1. In accordance with this construct, the metals Pb and M (where M is either strontium or barium) in Formula 1 above can be represented by the identifier A. Similarly, the identifier B can be represented by the combination of (Mg/Nb) and (Zr/Ti). Consequently for the present invention, the relative molar ratio of the A component, [Pb(Sr/Ba)], to the B component, [(Mg/Nb) and (Zr/Ti)], is about 1:1.

Within this construct, the relative atomic ratio of Pb to M (either Sr or Ba) can be selected and varied to provide a composition with the desired electromechanical properties. In a preferred embodiment, the relative atomic ratio of Mg to Nb is preselected to be about 1:2 Mg:Nb. The relative atomic ratio of Zr to Ti can range from about 1:3 to 3:1 (Zr:Ti).

Further, the relative ratio of the (Mg/Nb) component to the (Zr/Ti) component can vary. In a preferred embodiment, the relative ratio of (Mg/Nb) to (Zr/Ti) can be varied or selected to be between about 1:9 to about 7:3.

As noted above, the relative ratios of the metals in the ceramic can be varied to effect the desired electromechanical properties. Preferably, the relative ratios are selected to provide a ceramic composition exhibiting a structure that lies near or at the morphotropic phase boundary (MPB) area. The MPB delineates two solid phases, e.g., a tetragonal phase and a rhombohedral phase, that remain in a near-equilibrium state over a wide temperature range.

The preferred metal precursors for the present invention are selected to be metal oxides or metal carbonates. Preferably, the metal precursors are available as PbO, MgO, $Nb_2O_5$, $ZrO_2$, and $TiO_2$. Additionally, $SrCO_3$ and $BaCO_3$ can be used as the precursors for Sr and Ba. These metal precursors are commercially available from a number of commercial vendors and in various levels of purity. It is preferred that the metal precursors be at least 99.95% pure.

In other embodiments, the ceramic of the present invention can include one or more dopant materials. The dopant materials can be selected to modify and enhance the electromechanical properties of the resulting piezoelectric ceramic. Alternatively, one or more of the dopants can be added to the precursors to facilitate and/or ease processing steps to formulate of the desired ceramic. The dopants can be added to the present composition in individual amounts up to about 10 weight percent (wt %) based upon the total weight of the piezoelectric ceramic material. More preferably the dopants are included in the ceramic compositions in individual amounts between about 0.01 wt % and about 2.0 wt % based upon the total weight of the starting, precursor materials. Examples of the dopants for use in the present invention include manganese, niobium, tellurium, molybdenum, tantalum, cobalt, and yttrium ceramics. More preferably, the dopants are provided by one or more of the following dopant precursors: $MnO_2$, $Ni_2O_3$, $TeO_2$, $MoO_3$, $Nb_2O_5$, $Ta_2O_5$, $CoCO_3$, and $Y_2O_3$. One preferred composition includes up to about 0.3 wt % $MnO_2$, based upon the total weight of the starting precursor. Another preferred composition includes up to about 1.6 wt % $Nb_2O_5$, again, based upon the total weight of the starting precursor. Yet another preferred composition includes between about 0.2 and about 0.4 wt % $MnO_2$ and between about 1.4 and about 1.8 wt % $Nb_2O_5$.

These piezoelectric ceramics can be prepared by slurrying the selected powdered metal precursors in a liquid such as water or an alcohol. The suspended powder is pulverized in a ball mill until the mixed slurry is homogeneous and has a sufficiently small particle size. The resulting pulverized mixture is dried, preferably in an oven at elevated temperatures between about 100 and 150° C.

The resulting powder is thermally treated or calcined to form the desired perovskite structure. Preferably, the pulverized powder is heated to a selected temperature less than about 1000° C., more preferably to a temperature between about 700° C. to about 1000° C., still more preferably between about 800° C. and about 975° C. The powder is slowly heated to the selected temperature over a period of time. The heating rate can be varied considering the powder mass, the components in the powder, and the desired application for the final piezoceramic component. Preferably the powder is heated at a rate between about 100° C. and about 220° C. per hour, more preferably at a rate of between about 125° C. and 200° C. per hour, still more preferably at a rate of between about 150° C. and 190° C. per hour. Thereafter, the powder is held at the selected temperature for a time period. Again, the time period or hold time can be varied depending on the mass, identity, and amount of the components in the powder. Typically the powder is held at the selected temperature for a hold time between about 1 and about 10 hours, more preferably between about 2 and about 6 hours. After this thermal treatment, the powder is allowed to cool back to room temperature.

The calcined powder is re-pulverized in a ball mill as has been described above and then dried. This repulverized ceramic is then blended with a binder to provide a paste with the pulverized ceramic suspended in the paste. This paste is molded, pressed, or extruded as desired into a shaped article, alternatively referred to herein as a green article. For example, the shaped article can be molded into the shape of a generally parallel piped block or a round disk or any other desired shape. The binder can be removed from the article either by heating to evaporate the binder, heating to a higher temperature to decompose the binder or, more preferably, by using a solvent to dissolve the binder material. The solvent can be any desired solvent, preferably an organic solvent into which the binder material exhibits a suitably high solubility. Typical solvents include alcohols, acetone, chloroform, methylene chloride, and other polar organic solvents that exhibit a relatively low boiling point or high vapor pressure.

The green article is then sintered or fired at an elevated temperature range. The green article is placed in a suitable container such as an alumina crucible and additional (unmolded) ceramic powder is placed around the shaped article during the firing process. The elevated temperature range can be selected to be between about 900° C. and about 1350° C., more preferably between about 950° C. and about 1300° C. The article can be held at one or more selected temperatures within that temperature range for a time between about 10 and about 25 hours. More preferably, the article is slowly heated through the elevated temperature range at a selected heating rate. The heating rate can be selected by considering the mass or volume of the green article, the constituents in the ceramic, and the desired properties of the piezoceramic article. After the firing process, the article comprising the ferroelectric ceramic can be cooled to ambient temperature.

The ceramic article comprising the ferroelectric ceramic is then poled at about 70 to about 80 V per mil thickness of the article at a desired temperature or temperature range to provide the piezoelectric ceramic article. In one embodiment, the desired temperature is selected to be between about 90° C. and about 120° C.

In other embodiments, one or more different procedures for making the piezoelectric ceramic and/or or one or more different piezoelectric compositions (such as PZT4, PZT8, a composite variety, a single crystal of piezoelectric, and/or a piezoelectric polymer just to name a few non-limiting examples) can be alternatively, or additionally, utilized for the present invention as would occur to those skilled in the art.

Additionally, the electrode deposition and poling can be performed differently than that in the above described in connection with other processes.

For example, poling electrode deposition on the ceramic article can be accomplished by sputtering or screen printing processes. Typically, the electrodes are deposited on the opposing faces of the article. In one form, the electrode metallization includes low temperature sputtering of gold or an alloy thereof; however, other deposition processes and/or materials suitable for electrode formation can be utilized in different embodiments.

The ceramic of the article is poled (polarized). Polarization can be accomplished by subjecting the ceramic article to the following regime: (a) a slow ramp-up to an elevated temperature, (b) a slow ramp-up of a polarizing electric field (voltage) across the electrodes while maintaining the elevated temperature, (c) a slow ramp-down to room temperature while the field is maintained, and (d) a slow ramp down of the electric field while at room temperature. Temperature changes are performed at a rate of about 1° C. per minute and voltage changes are gradual to a maximum of about 50–80 volts per mil thickness of material with a dwell time at maximum temperature and voltage of about 5 minutes. Performance parameters of the piezoelectric ceramic are tested after poling. If desired at this stage, or at another stage of the process, the poling electrodes can be removed.

The resulting piezoelectric ceramic can be further processed as desired. In one form, the piezoelectric ceramic is used as a monolithic ceramic or billet for a particular device. Electrodes can be patterned on monolithic ceramic to provide a single piezoelectric element. In other embodiments, two, three, or more piezoelectric ceramic articles can be combined or laminated together. Each of the laminates typically contain separate electrodes. The laminate elements can be used to form a device such as actuators or projectors. In yet other embodiments, the piezoelectric ceramic can either be cut into a number of smaller units or combined with a number of different piezoelectric ceramics that either have the same or different electromechanical properties. Electrodes can be patterned on each of the smaller units or different piezoelectric ceramics, which can be combined to form a multi-element array.

In any of these applications, electrodes are deposited on the piezoelectric ceramic positioned and sized for the particular use of the resulting electronic device. Examples of electronic devices that can utilize the piezoelectric ceramics of the present invention are described and illustrated in U.S. patent application Ser. No. 10/686,120 filed on Oct. 15, 2003, and entitled "Ultrasonic Element Array"; US Provisional Patent Application Ser. No. 60/478,649, filed on Jun. 13, 2003, and entitled "Multi-Element Array for Acoustic Ablation"; and U.S. Patent Application Ser. No. 60/475,144, filed on Jun. 1, 2003, and entitled "Droplet Generation with a Piezoelectric Device", all of which are incorporated by reference herein in their entirety.

For the purpose of promoting further understanding and appreciation of the present invention and its advantages, the following Examples are provided. It will be understood, however, that these Examples are illustrative and not limiting in any fashion.

For the following examples, the measurements were performed on a computer-controlled Hewlett-Packard 4149A impedance/gain-phase analyzer. The measured parameters were a dielectric constant ($K'$), a dielectric loss factor ($\tan \delta$), a mechanical quality factor ($Q_m$), relative permittivity ($\in$) ($\in=K'-1 \approx K'$), a thickness coupling coefficient ($K_t$), and a planar coupling coefficient ($K_p$). The density of the ceramic samples was measured by weighing the individual samples and determining the volume of the individual samples. The Berlincourt d33 meter was used to determine the piezoelectric charge constant.

EXAMPLE 1

Figure 2:
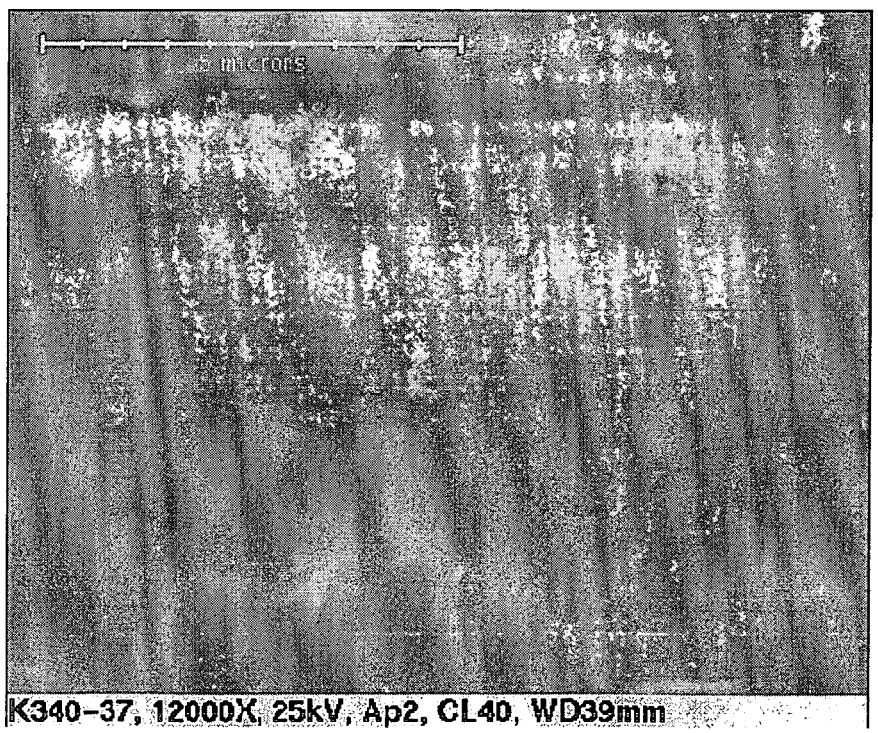
FIG. 2 is a scanned image of a micrograph of the piezoelectric ceramic produced after poling the ferroelectric ceramic composition described in Example 1.

The following powdered ceramics were combined: PbO, 670.9 g; $ZrO_2$, 95.7; $TiO_2$, 96.1 g; $Nb_2O_5$, 121.0 g; MgO, 18.23 g; $SrCO_3$, 28.14; and $MnO_2$, 3.0 g. This combination of powders includes 1 wt % PbO, 1.6 wt % $Nb_2O_5$, and 0.3 wt % $MnO_2$ as dopant precursors. These powders were then suspended in 900 ml of deionized water and ball milled for about 16 hours. The resulting powdered slurry was then dried at 130° C. The dried powder was calcined at 950° C. for 3 hours. Thereafter the calcined ceramic powder was cooled to ambient temperature. The resulting ceramic was then re-pulverized by suspending in 1000 ml of deionized water and ball milling for 7 hours. The pulverized ceramic was again dried at 130° C. to evaporate the water. The dried powder was suspended in a 5% polyvinyl alcohol (PVA) solution to provide a paste. This paste was extruded through a 1 7/16" slotted die under 1500 lb force to form a ceramic billet. This ceramic billet was fired at 1240° C. for 2.5 hours to produce the ferroelectric ceramic. FIG. 1 is a scanned image of a micrograph of the resulting ferroelectric ceramic. The ferroelectric ceramic before poling exhibits a uniform, fine grain size in a range of between 3 and 5 micrometers. Thereafter the ceramic billet was cooled to ambient temperature. Silver electrodes were patterned on the ceramic billet according to standard procedures. The resulting billet was then poled (polarized) at 115° C. and 70–80 V/mil for about 10 minutes. FIG. 2 is a scanned image of a micrograph of the resulting piezoelectric ceramic. The poled ceramic exhibits a fine and uniform grain structure similar to that exhibited by the unpoled ceramic. The electromechanical properties of the resulting piezoelectric ceramic were evaluated and are listed below in Table 1.

EXAMPLE 2

The following powdered ceramics were combined: PbO, 686.7 g; $ZrO_2$, 96.9; $TiO_2$, 94.1 g; $Nb_2O_5$, 104.2 g; MgO, 18.2 g; $SrCO_3$, 14.0; $Ni_2O_3$ 5.09 g; and $MnO_2$, 10.0 g. These powders were then suspended in 900 ml of deionized water and ball milled for about 18 hours. The resulting powdered slurry was then dried at 130° C. The dried powder was calcined at 950° C. for 4 hours. Thereafter calcined ceramic powder was cooled to ambient temperature. The resulting ceramic was then re-pulverized by suspending in 700 ml of deionized water and ball milling for 18 hours. The pulverized ceramic was again dried at 130° C. to evaporate the water. The dried powder was suspended in a 5% polyvinyl alcohol (PVA) solution to provide a paste. This paste was extruded through a 1 7/16" slotted die under 3000 lb. force to form a ceramic billet, which was then "bisqued" at 600° C. in a kiln. This ceramic billet was fired at 1260° C. for 2.5 hours. Thereafter the ceramic billet was cooled to ambient temperature. Silver electrodes were patterned on the ceramic billet according to standard procedures. The resulting billet was then poled (polarized) at 115° C. and 70–80 V/mil for about 10 minutes. The electromechanical properties of the resulting piezoelectric ceramic were evaluated and are listed below in Table 1.

EXAMPLE 3

The following powdered ceramics were combined: PbO, 653.9 g; $ZrO_2$, 98.3; $TiO_2$, 95.4 g; $Nb_2O_5$, 105.7 g; MgO, 18.4 g; $SrCO_3$, 42.5; $Ni_2O_3$ 5.0 g; and $MnO_2$, 5.0 g. These powders were then suspended in 900 ml of deionized water and ball milled for about 18 hours. The resulting powdered slurry was then dried at 130° C. The dried powder was calcined at 950° C. for 4 hours. Thereafter calcined ceramic powder was cooled to ambient temperature. The resulting ceramic was then re-pulverized by suspending in 650 ml of deionized water and ball milling for 20 hours. The pulverized ceramic was again dried at 130° C. to evaporate the water. The dried powder was suspended in a 5% polyvinyl alcohol (PVA) solution to provide a paste. This paste was extruded through a 1 7/16" slotted die under 3000 lb. force and "bisqued" as described in Example 2 above to form a ceramic billet. This ceramic billet was fired at 1240° C. for 2.5 hours. Thereafter the ceramic billet was cooled to ambient temperature. Silver electrodes were patterned on the ceramic billet according to standard procedures. The resulting billet was then poled (polarized) at 115° C. and 70–80 V/mil for about 10 minutes. The electromechanical properties of the resulting piezoelectric ceramic were evaluated and are listed below in Table 1.

EXAMPLE 4

The following powdered ceramics were combined: PbO, 644.9 g; $ZrO_2$, 96.9; $TiO_2$, 94.1 g; $Nb_2O_5$, 104.2 g; MgO, 18.2 g; $BaCO_3$, 56.0 g; $Ni_2O_3$ 5.0 g; and $MnO_2$, 5.0 g. These powders were then suspended in 900 ml of deionized water and ball milled for about 18 hours. The resulting powdered slurry was then dried at 130° C. The dried powder was calcined at 950° C. for 4 hours. Thereafter calcined ceramic powder was cooled to ambient temperature. The resulting ceramic was then re-pulverized by suspending in 500 ml of deionized water and ball milling for 20 hours. The pulverized ceramic was again dried at 130° C. to evaporate the water. The dried powder was suspended in a 5% polyvinyl alcohol (PVA) solution to provide a paste, which was extruded through a 1 7/16" slotted die under 3000 lb. force and "bisqued" as described in Example 2 above to form a ceramic billet. This ceramic billet was fired at 1260° C. for 2.5 hours. Thereafter the ceramic billet was cooled to ambient temperature. Silver electrodes were patterned on the ceramic billet according to standard procedures. The resulting billet was then poled (polarized) at 115° C. and 70–80 V/mil for about 10 minutes. The electromechanical properties of the resulting piezoelectric ceramic were evaluated and are listed below in Table 1.

EXAMPLE 5

The following powdered ceramics were combined: PbO, 663.5 g; $ZrO_2$, 92.2; $TiO_2$, 99.1 g; $Nb_2O_5$, 121.5 g; MgO, 18.42 g; $SrCO_3$, 35.35 g (not ground); $Ni_2O_3$, 10.0 g; and $MnO_2$, 5.5 g. These powders were then suspended in 900 ml of deionized water and ball milled for about 16 hours. The resulting powdered slurry was the n dried at 130° C. The dried powder was calcined at 950° C. for 3 hours. Thereafter calcined ceramic powder was cooled to ambient temperature. The resulting ceramic was then re-pulverized by suspending in 900 ml of deionized water and ball milling for 7 hours. The pulverized ceramic was again dried at 130° C. to evaporate the water. The dried powder was suspended in a 5% polyvinyl alcohol (PVA) solution to provide a paste. This paste was extruded through a 1 7/16" slotted die under 2000 lb. force to form a ceramic billet. This ceramic billet was fired at 1240° C. for 2.5 hours. Thereafter the ceramic billet was cooled to ambient temperature. Silver electrodes were patterned on the ceramic billet according to standard procedures. The resulting billet was then poled (polarized) at 115° C. and 70–80 V/mil for about 10 minutes. It was noted that increasing the $Ni_2O_3$ dopant from about 0.5 wt % to about 1.0 wt % also increased ∈. The electromechanical properties of the resulting piezoelectric ceramic were evaluated and are listed below in Table 1.

TABLE 1

| Example | Density ρ g/ml | Relative Permittivity ∈ (F/m) | Mechanical Quality Factor $Q_m$ | Piezoelectric Strain Constant $d_{33}$ (PC/N) | Curie Temperature ° C. | Coupling Constant $K_t$ | Planar Coupling Constant $K_p$ |
|---|---|---|---|---|---|---|---|
| 1 | 7.75 | 3027 | 1088 | 351/392 | 215 | 0.475 | 0.52 |
| 2 | 7.69 | 1247 | 1133 | 275 | | 0.48 | 0.49 |
| 3 | 7.62 | 3840 | 340 | 450 | | 0.42 | 0.49 |
| 4 | 7.61 | 3390 | 536 | 450 | | 0.48 | 0.49 |
| 5 | 7.66 | 3248 | 1292 | 395 | | 0.45 | 0.54 |

The present invention contemplates modifications as would occur to those skilled in the art. It is also contemplated that fabrication processes embodied in the present invention can be altered, rearranged, or added to other processes as would occur to those skilled in the art without departing from the spirit of the present invention. All publications, patents, and patent applications cited in this specification are herein incorporated by reference as if each individual publication, patent, or patent application was specifically and individually indicated to be incorporated by reference and set forth in its entirety herein.

Further, any theory of operation, proof, or finding stated herein is meant to further enhance understanding of the present invention and is not intended to make the scope of the present invention dependent upon such theory, proof, or finding.

Unless specifically identified to the contrary, all terms used herein are used to include their normal and customary terminology.

While the invention has been illustrated and described in detail and foregoing examples, the same is considered to be illustrative and not restrictive in character, it is understood that only the preferred embodiments have been shown and described and that all changes and modifications that come within the spirit of the invention are desired to be protected.

What is claimed is:

1. A PZT-type piezoelectric ceramic composition consisting essentially of Pb, Sr, Mg, Nb, Zr, Ti, and Mn in the following relative amounts:

$$Pb_{0.91}Sr_{0.06}Mg_{0.14}Nb_{0.28}Zr_{0.24}Ti_{0.37}Mn_{0.01}.$$

2. A PZT-type piezoelectric ceramic composition consisting essentially of Pb, Sr, Mg, Nb, Zr, Ti, Mn, and Ni in the following relative amounts:

$$Pb_{0.94}Sr_{0.03}Mg_{0.14}Nb_{0.24}Zr_{0.24}Ti_{0.36}Mn_{0.04}Ni_{0.02}.$$

3. A PZT-type piezoelectric ceramic composition consisting essentially of Pb, Sr, Mg, Nb, Zr, Ti, Mn, and Ni in the following relative amounts:

$$Pb_{0.89}Sr_{0.09}Mg_{0.14}Nb_{0.24}Zr_{0.24}Ti_{0.36}Mn_{0.02}Ni_{0.02}.$$

4. A PZT-type piezoelectric ceramic composition consisting essentially of Pb, Ba, Mg, Nb, Zr, Ti, Mn, and Ni in the following relative amounts:

$$Pb_{0.89}Ba_{0.09}Mg_{0.014}Nb_{0.24}Zr_{0.24}Ti_{0.36}Mn_{0.02}Ni_{0.02}.$$

5. A PZT-type piezoelectric ceramic composition consisting essentially of Pb, Sr, Mg, Nb, Zr, Ti, Mn, and Ni in the following relative amounts:

$$Pb_{0.88}Sr_{0.07}Mg_{0.14}Nb_{0.27}Zr_{0.22}Ti_{0.37}Mn_{0.02}Ni_{0.04}.$$

* * * * *